(12) United States Patent
Enomoto et al.

(10) Patent No.: US 12,184,245 B2
(45) Date of Patent: Dec. 31, 2024

(54) POWER AMPLIFIER CIRCUIT

(71) Applicant: Murata Manufacturing Co., Ltd., Kyoto (JP)

(72) Inventors: Jun Enomoto, Kyoto (JP); Yuri Honda, Kyoto (JP); Satoshi Tanaka, Kyoto (JP); Fumio Harima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 568 days.

(21) Appl. No.: 17/410,003

(22) Filed: Aug. 24, 2021

(65) Prior Publication Data
US 2022/0069780 A1 Mar. 3, 2022

(30) Foreign Application Priority Data

Aug. 25, 2020 (JP) ................. 2020-141614

(51) Int. Cl.
*H03F 3/21* (2006.01)
*H03F 1/02* (2006.01)
*H03F 1/56* (2006.01)

(52) U.S. Cl.
CPC ............ *H03F 3/211* (2013.01); *H03F 1/0211* (2013.01); *H03F 1/565* (2013.01); *H03F 2200/222* (2013.01); *H03F 2200/267* (2013.01); *H03F 2200/318* (2013.01); *H03F 2200/451* (2013.01); *H03F 2200/537* (2013.01)

(58) Field of Classification Search
CPC ........ H03F 3/211; H03F 1/0211; H03F 1/565; H03F 2200/222; H03F 2200/267; H03F 2200/318; H03F 2200/451; H03F 2200/537; H03F 3/19; H03F 1/30; H03F 1/0205

USPC ................... 330/296, 310, 302, 98
See application file for complete search history.

(56) References Cited

U.S. PATENT DOCUMENTS 3,495,031 A * 2/1970 Rocco .................. H04N 5/4446
348/707
3,559,091 A * 1/1971 Lunden et al. ......... H03F 1/565
330/165

(Continued)

FOREIGN PATENT DOCUMENTS

JP 2004-266875 A 9/2004
JP 2010-200107 A 9/2010

(Continued)

*Primary Examiner* — Hieu P Nguyen
(74) *Attorney, Agent, or Firm* — Pearne & Gordon LLP

(57) ABSTRACT

A power amplifier circuit includes: a high pass filter that has one end into which a high frequency input signal is inputted; a first amplifier that amplifies the high frequency input signal outputted from the other end of the high pass filter and outputs a high frequency signal obtained through the first amplification; a second amplifier that amplifies the high frequency signal and outputs a high frequency output signal obtained through the second amplification; an automatic transformer that performs impedance matching between the first amplifier and the second amplifier; and an impedance circuit, one end of which is electrically connected with the other end of the high pass filter, the other end of which is electrically connected with an output terminal of a bias circuit outputting bias voltage or bias current to the first amplifier, and that outputs the high frequency input signal to the bias circuit.

14 Claims, 14 Drawing Sheets

(56) References Cited

U.S. PATENT DOCUMENTS

| | | | | |
|---|---|---|---|---|
| 4,994,761 A | * | 2/1991 | Craft | H03F 1/0233 |
| | | | | 330/306 |
| 4,994,791 A | * | 2/1991 | Taylor | G02B 6/2861 |
| | | | | 374/161 |
| 2010/0090767 A1 | | 4/2010 | Ohnishi et al. | |
| 2010/0102885 A1 | | 4/2010 | Heston et al. | |
| 2010/0216411 A1 | | 8/2010 | Kurita | |
| 2017/0257069 A1 | | 9/2017 | Mooney et al. | |
| 2018/0342992 A1 | | 11/2018 | Sato | |

FOREIGN PATENT DOCUMENTS

| | | |
|---|---|---|
| JP | 2018-198355 A | 12/2018 |
| WO | 2008/093477 A1 | 8/2008 |

\* cited by examiner

POWER AMPLIFIER CIRCUIT

CROSS REFERENCE TO RELATED APPLICATION

This application claims priority from Japanese Patent Application No. 2020-141614 filed on Aug. 25, 2020. The content of this application is incorporated herein by reference in its entirety.

BACKGROUND

The present disclosure relates to a power amplifier circuit.

An amplifier circuit that flattens a gain in a frequency band (hereinafter, sometimes referred to as a "signal band") of a high frequency signal is known (for example, see Japanese Unexamined Patent Application Publication No. 2010-200107).

The maximum available power gain (MAG) of a transistor constituting an amplifier has characteristics in which the MAG is high in a low frequency region and becomes lower as the frequency rises. The technique described in Japanese Unexamined Patent Application Publication No. 2010-200107 therefore employs a high pass filter as an inter-stage matching circuit. Accordingly, a high frequency signal obtained by attenuating low frequency components by the high pass filter is inputted into a base of a transistor. The characteristics of the maximum available power gain of the transistor are consequently canceled, thereby flattening a signal level of the high frequency signal outputted from a collector of the transistor.

Japanese Unexamined Patent Application Publication No. 2004-266875 and U.S. Patent Application Publication No. 2017/0257069 are also examples of related art.

BRIEF SUMMARY

The technique described in Japanese Unexamined Patent Application Publication No. 2010-200107 employs the high pass filter as an inter-stage matching circuit as described above. That is, the technique described in Japanese Unexamined Patent Application Publication No. 2010-200107 attenuates a high frequency signal near a lower limit frequency of the signal band, that is, near a cutoff frequency of the high pass filter. The technique described in Japanese Unexamined Patent Application Publication No. 2010-200107 consequently generates power loss near the lower limit frequency of the signal band and degrades power efficiency.

The above-mentioned power loss is generated in an amplifier on each stage in the technique described in Japanese Unexamined Patent Application Publication No. 2010-200107. In an amplifier circuit in which a plurality of amplifiers are connected in multiple stages, the transistor size (the number of fingers) is larger and more power is consumed as it goes to posterior stages. Accordingly, power loss is increased as it goes to posterior stages in the technique described in Japanese Unexamined Patent Application Publication No. 2010-200107. That is, the influence of power loss generated in amplifiers in posterior stages is larger than that of power loss generated in amplifiers in previous stages and thus, the power loss in the amplifiers in posterior stages causes large degradation in overall power efficiency of the amplifier circuit.

The present disclosure suppresses power efficiency degradation.

According to an aspect of the present disclosure, a power amplifier circuit includes: a high pass filter that has one end into which a high frequency input signal is inputted; a first amplifier that amplifies the high frequency input signal outputted from the other end of the high pass filter and outputs a high frequency signal obtained through the first amplification; a second amplifier that amplifies the high frequency signal and outputs a high frequency output signal obtained through the second amplification; an automatic transformer that is electrically connected between the first amplifier and the second amplifier and performs impedance matching between the first amplifier and the second amplifier; and an impedance circuit, one end of which is electrically connected with the other end of the high pass filter, the other end of which is electrically connected with an output terminal of a bias circuit outputting bias voltage or bias current to the first amplifier, and that outputs the high frequency input signal, outputted from the other end of the high pass filter, to the bias circuit.

According to another aspect of the present disclosure, a power amplifier circuit includes: a high pass filter that has one end into which a high frequency input signal is inputted; a first amplifier that amplifies the high frequency input signal outputted from the other end of the high pass filter and outputs a high frequency signal obtained through the first amplification; a second amplifier that amplifies the high frequency signal and outputs a high frequency output signal obtained through the second amplification; a transmission line transformer that is electrically connected between the first amplifier and the second amplifier and performs impedance matching between the first amplifier and the second amplifier; and an impedance circuit, one end of which is electrically connected with the other end of the high pass filter, the other end of which is electrically connected with an output terminal of a bias circuit outputting bias voltage or bias current to the first amplifier, and that outputs the high frequency input signal, outputted from the other end of the high pass filter, to the bias circuit.

According to still another aspect of the present disclosure, a power amplifier circuit includes: a high pass filter that has one end into which a high frequency input signal is inputted; a first amplifier that amplifies the high frequency input signal outputted from the other end of the high pass filter and outputs a high frequency signal obtained through the first amplification; a second amplifier that amplifies the high frequency signal and outputs a high frequency output signal obtained through the second amplification; a conventional transformer that is electrically connected between the first amplifier and the second amplifier and performs impedance matching between the first amplifier and the second amplifier; and an impedance circuit, one end of which is electrically connected with the other end of the high pass filter, the other end of which is electrically connected with an output terminal of a bias circuit outputting bias voltage or bias current to the first amplifier, and that outputs the high frequency input signal, outputted from the other end of the high pass filter, to the bias circuit.

According to the present disclosure, power efficiency degradation can be suppressed.

Other features, elements, characteristics and advantages of the present disclosure will become more apparent from the following detailed description of embodiments of the present disclosure with reference to the attached drawings.

DETAILED DESCRIPTION

A power amplifier circuit according to embodiments of the present disclosure will be described in detail below with reference to the accompanying drawings. Here, the present disclosure is not limited to these embodiments. It goes without necessary saying that each of the embodiments is an example, and partial replacement or combination of the configurations described in different embodiments is possible. Descriptions for matters common to those in a first embodiment will be omitted and only the differences will be described in the second and subsequent embodiments. In particular, the same advantageous effects of the same configurations will not be mentioned sequentially for each embodiment.

First Embodiment and Comparison Examples

First Embodiment

Figure 1:
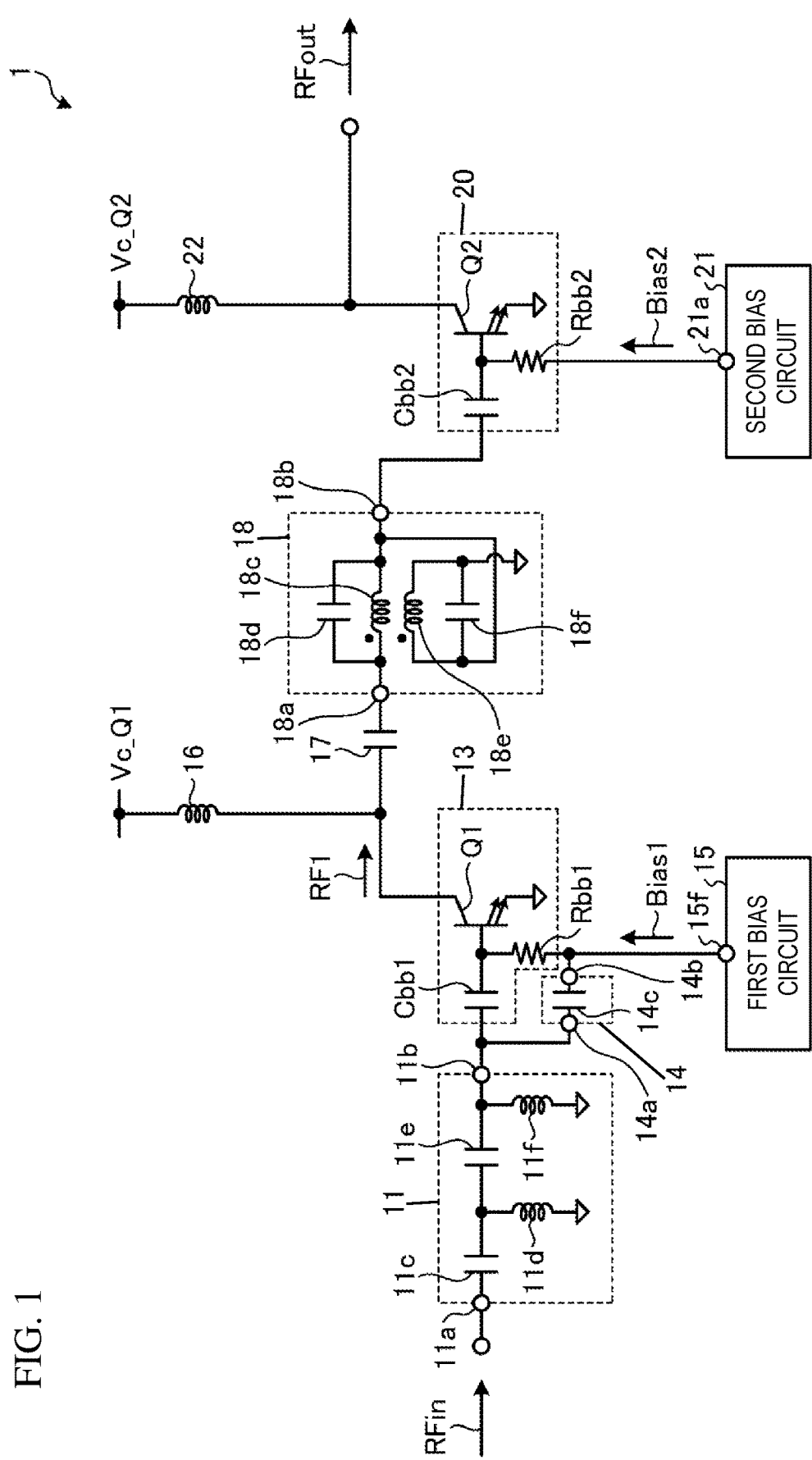
FIG. 1 illustrates the configuration of a power amplifier circuit according to a first embodiment.

FIG. 1 illustrates the configuration of a power amplifier circuit according to a first embodiment. A power amplifier circuit 1 includes a high pass filter 11, a first amplifier 13, an impedance circuit 14, a first bias circuit 15, a choke coil 16, a DC cut capacitor 17, an automatic transformer (autotransformer) 18, a second amplifier 20, a second bias circuit 21, and a choke coil 22.

The power amplifier circuit 1 is a multistage amplifier circuit in which the first amplifier 13 serves as an initial stage amplifier or a driver stage amplifier and the second amplifier 20 serves as a final stage amplifier or a power stage amplifier. The high pass filter 11 is an input matching circuit for the first amplifier 13. The automatic transformer 18 is an inter-stage matching circuit that performs impedance matching between the first amplifier 13 and the second amplifier 20.

The power amplifier circuit 1 is a two-stage amplifier circuit in the first embodiment, but the present disclosure is not limited to this. The power amplifier circuit 1 may be an amplifier circuit of three or more stages.

The first amplifier 13 includes a DC cut capacitor Cbb1, a resistor Rbb1, and a transistor Q1. The second amplifier 20 includes a DC cut capacitor Cbb2, a resistor Rbb2, and a transistor Q2.

The present disclosure employs a bipolar transistor as each transistor, but the present disclosure is not limited to this. A heterojunction bipolar transistor (HBT) is exemplified as the bipolar transistor, but the present disclosure is not limited to this. The transistor may be a field effect transistor (FET), for example. The transistor may also be a multi-finger transistor in which a plurality of unit transistors are electrically connected in parallel. The unit transistor is the minimal configuration constituting a transistor.

The size (the number of fingers) of the transistor Q2 in the second amplifier 20 is larger than the size (the number of fingers) of the transistor Q1 in the first amplifier 13, for example.

The high pass filter 11 includes capacitors $11c$ and $11e$ and inductors $11d$ and $11f$.

A high frequency input signal RFin is inputted into one end $11a$ of the high pass filter 11. One end of the capacitor $11c$ is electrically connected with one end $11a$ of the high pass filter 11. One end of the inductor $11d$ is electrically connected with the other end of the capacitor $11c$. The other end of the inductor $11d$ is electrically connected with a reference potential. A ground potential is exemplified as the reference potential, but the present disclosure is not limited to this. One end of the capacitor $11e$ is electrically connected with the other end of the capacitor $11c$ and one end of the inductor $11d$. One end of the inductor $11f$ is electrically connected with the other end of the capacitor $11e$. The other end of the capacitor $11e$ and one end of the inductor $11f$ are electrically connected with the other end $11b$ of the high pass filter 11.

The high pass filter 11 allows the high frequency input signal RFin to pass through a high frequency range and outputs the high frequency input signal RFin from the other end $11b$.

The lower limit frequency of the frequency band of the high frequency input signal RFin is exemplified as a cutoff frequency of the high pass filter 11, but the present disclosure is not limited to this.

One end of the DC cut capacitor Cbb1 is electrically connected with the other end $11b$ of the high pass filter 11. The other end of the DC cut capacitor Cbb1 is electrically connected with the base of the transistor Q1.

The DC cut capacitor Cbb1 blocks DC components of the high frequency input signal RFin after passing through the high pass filter 11 and passes AC components of the same.

One end of the resistor Rbb1 is electrically connected with the base of the transistor Q1. To the other end of the resistor Rbb1, bias voltage (or bias current) Bias1 is inputted from an output terminal 15f of the first bias circuit 15.

The impedance circuit 14 includes a capacitor 14c. One end of the capacitor 14c is electrically connected with one end 14a of the impedance circuit 14. One end 14a of the impedance circuit 14 is electrically connected with the other end 11b of the high pass filter 11 and one end of the DC cut capacitor Cbb1. The other end of the capacitor 14c is electrically connected with the other end 14b of the impedance circuit 14. The other end 14b of the impedance circuit 14 is electrically connected with the output terminal 15f of the first bias circuit 15 and the other end of the resistor Rbb1.

The impedance circuit 14 blocks DC components of the high frequency input signal RFin after passing through the high pass filter 11, passes AC components of the same, and outputs the high frequency input signal RFin to the output terminal 15f of the first bias circuit 15.

The emitter of the transistor Q1 is electrically connected with the reference potential. To the base of the transistor Q1, the bias voltage (or the bias current) Bias1 is inputted from the output terminal 15f of the first bias circuit 15 via the resistor Rbb1. Further, to the base of the transistor Q1, the high frequency input signal RFin after passing through the high pass filter 11 and the DC cut capacitor Cbb1 is inputted. The collector of the transistor Q1 is electrically connected with a power source potential Vc_Q1 via the choke coil 16 to be supplied with power.

The transistor Q1 amplifies the high frequency input signal RFin after passing through the high pass filter 11 and outputs a high frequency signal RF1 obtained through the amplification from the collector to the DC cut capacitor 17.

Figure 2:
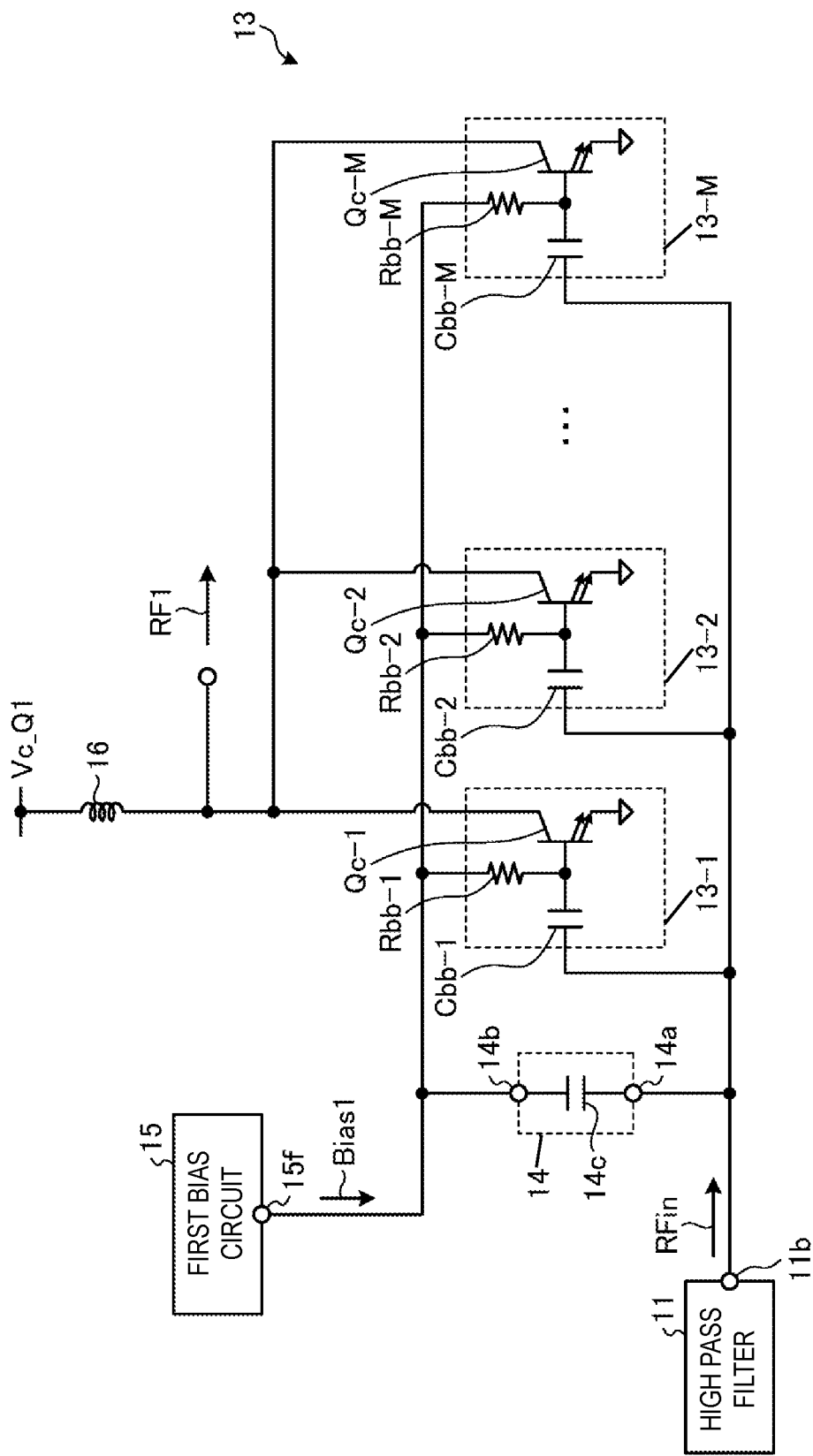
FIG. 2 illustrates the configuration of a first amplifier of the power amplifier circuit according to the first embodiment.

FIG. 2 illustrates the configuration of the first amplifier of the power amplifier circuit according to the first embodiment.

The first amplifier 13 includes M pieces (M is a natural number) of cells that are a cell 13-1, a cell 13-2, . . . , and a cell 13-M. The cell 13-1 includes a cell capacitor Cbb-1, a cell resistor Rbb-1, and a unit transistor Qc-1. The cell 13-2 includes a cell capacitor Cbb-2, a cell resistor Rbb-2, and a unit transistor Qc-2. The cell 13-M includes a cell capacitor Cbb-M, a cell resistor Rbb-M, and a unit transistor Qc-M. The cell 13-1 to the cell 13-M are connected with each other in parallel.

The cell capacitor Cbb-1 to the cell capacitor Cbb-M correspond to the DC cut capacitor Cbb1. The cell resistor Rbb-1 to the cell resistor Rbb-M correspond to the resistor Rbb1. The unit transistor Qc-1 to the unit transistor Qc-M correspond to the transistor Q1.

One end 14a of the impedance circuit 14 is electrically connected with the other end 11b of the high pass filter 11 and one end of the cell capacitor Cbb of each cell. The other end 14b of the impedance circuit 14 is electrically connected with the output terminal 15f of the first bias circuit 15 and the other end of the cell resistor Rbb of each cell.

Referring back to FIG. 1, one end of the DC cut capacitor 17 is electrically connected with the collector of the transistor Q1. The other end of the DC cut capacitor 17 is electrically connected with one end 18a of the automatic transformer 18.

The DC cut capacitor 17 blocks DC components of the high frequency signal RF1 and passes AC components of the same.

The automatic transformer 18 includes a first winding 18c, a second winding 18e, and capacitors 18d and 18f.

The first winding 18c and the capacitor 18d are electrically connected with each other in parallel. One ends of the first winding 18c and the capacitor 18d are electrically connected with one end 18a of the automatic transformer 18. The other ends of the first winding 18c and the capacitor 18d are electrically connected with the other end 18b of the automatic transformer 18. The second winding 18e and the capacitor 18f are electrically connected with each other in parallel. One ends of the second winding 18e and the capacitor 18f are electrically connected with the other ends of the first winding 18c and the capacitor 18d. The other ends of the second winding 18e and the capacitor 18f are electrically connected with the reference potential.

The automatic transformer 18 is one example of a wideband and low-loss matching circuit that performs impedance matching between output impedance of the first amplifier 13 and input impedance of the second amplifier 20.

One end of the DC cut capacitor Cbb2 is electrically connected with the other end 18b of the automatic transformer 18. The other end of the DC cut capacitor Cbb2 is electrically connected with the base of the transistor Q2.

The DC cut capacitor Cbb2 blocks DC components of the high frequency signal RF1 after passing through the automatic transformer 18, and passes AC components of the same.

One end of the resistor Rbb2 is electrically connected with the base of the transistor Q2. To the other end of the resistor Rbb2, bias voltage (or bias current) Bias2 is inputted from an output terminal 21a of the second bias circuit 21.

The emitter of the transistor Q2 is electrically connected with the reference potential. To the base of the transistor Q2, the bias voltage (or the bias current) Bias2 is inputted from the output terminal 21a of the second bias circuit 21 via the resistor Rbb2. Further, to the base of the transistor Q2, the high frequency signal RF1 after passing through the automatic transformer 18 and the DC cut capacitor Cbb2 is inputted. The collector of the transistor Q2 is electrically connected with a power source potential Vc_Q2 via the choke coil 22 to be supplied with power.

The transistor Q2 amplifies the high frequency signal RF1 after passing through the automatic transformer 18 and outputs a high frequency output signal RFout obtained through the amplification from the collector thereof.

Figure 3:
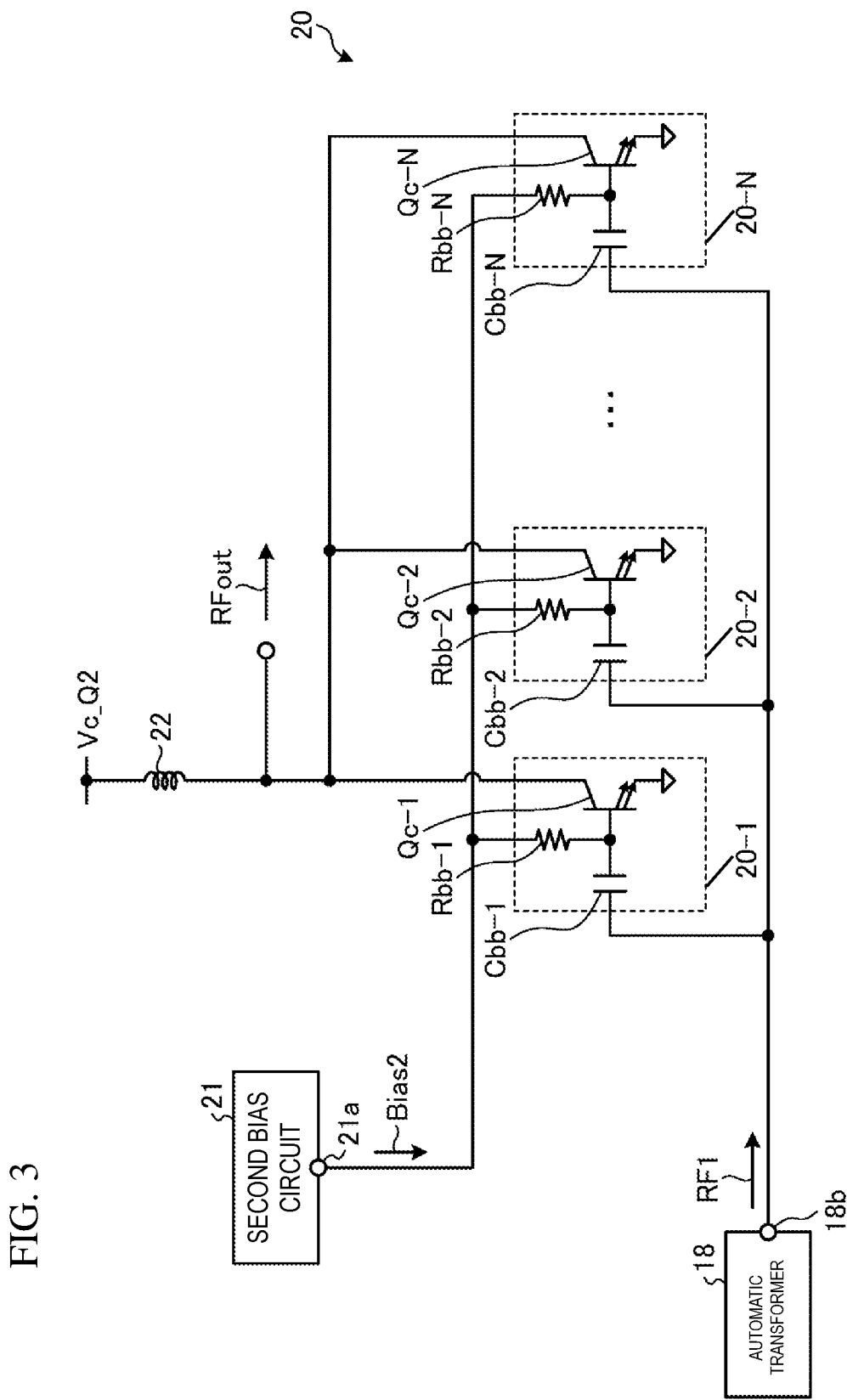
FIG. 3 illustrates the configuration of a second amplifier of the power amplifier circuit according to the first embodiment.

FIG. 3 illustrates the configuration of the second amplifier of the power amplifier circuit according to the first embodiment.

The second amplifier 20 includes N pieces (N is a natural number which is larger than M) of cells that are a cell 20-1, a cell 20-2, . . . , and a cell 20-N. The cell 20-1 includes a cell capacitor Cbb-1, a cell resistor Rbb-1, and a unit transistor Qc-1. The cell 20-2 includes a cell capacitor Cbb-2, a cell resistor Rbb-2, and a unit transistor Qc-2. The cell 20-N includes a cell capacitor Cbb-N, a cell resistor Rbb-N, and a unit transistor Qc-N. The cell 20-1 to the cell 20-N are connected with each other in parallel.

The cell capacitor Cbb-1 to the cell capacitor Cbb-N correspond to the DC cut capacitor Cbb2. The cell resistor Rbb-1 to the cell resistor Rbb-N correspond to the resistor Rbb2. The unit transistor Qc-1 to the unit transistor Qc-N correspond to the transistor Q2.

Figure 4:
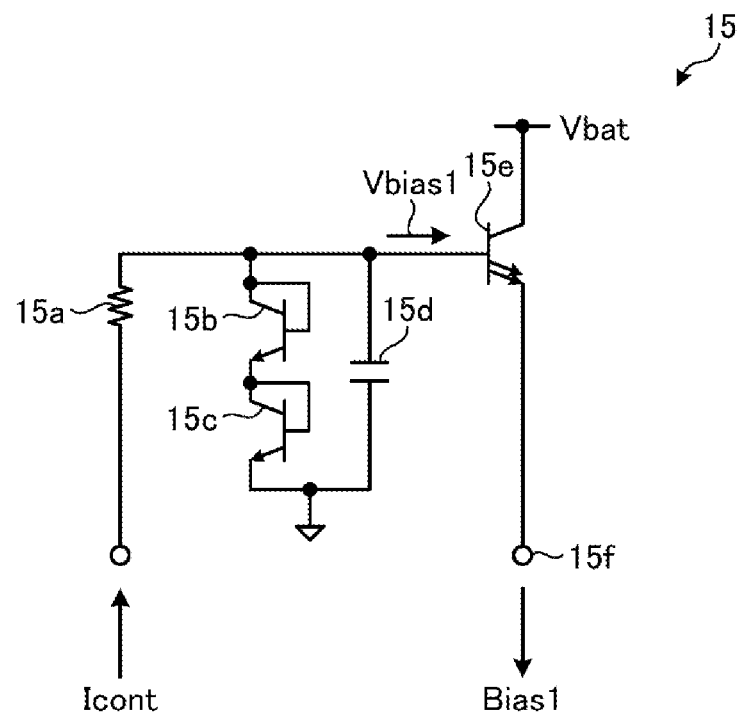
FIG. 4 illustrates the configuration of a bias circuit of the power amplifier circuit according to the first embodiment.

FIG. 4 illustrates the configuration of the bias circuit of the power amplifier circuit according to the first embodiment. The circuit configuration of the first bias circuit 15 is described with reference to FIG. 4. The circuit configuration of the second bias circuit 21 is the same as the circuit configuration of the first bias circuit 15, so illustration and description thereof will be omitted.

The first bias circuit 15 includes a resistor 15a, transistors 15b, 15c, and 15e, and a capacitor 15d.

Constant current Icont is inputted into one end of the resistor 15a. As to the constant current Icont, current to be supplied is changed depending on operating conditions.

In the transistor 15b, the collector and the base are electrically connected with each other. That is, the transistor 15b is diode-connected. The collector and the base of the transistor 15b are electrically connected with the other end of the resistor 15a.

In the transistor 15c, the collector and the base are electrically connected with each other. That is, the transistor 15c is diode-connected. The collector and the base of the transistor 15c are electrically connected with the emitter of the transistor 15b. The emitter of the transistor 15c is electrically connected with the reference potential.

A series connection circuit of the transistors 15b and 15c generates a fixed potential Vbias1 depending on the constant current Icont.

One end of the capacitor 15d is electrically connected with the collector and the base of the transistor 15b. The other end of the capacitor 15d is electrically connected with the reference potential.

The capacitor 15d stabilizes the potential Vbias1 of the series connection circuit of the transistors 15b and 15c.

The base of the transistor 15e is electrically connected with one end of the capacitor 15d and supplied with the potential Vbias1. The collector of the transistor 15e is electrically connected with a power source potential Vbat. The emitter of the transistor 15e is electrically connected with the other end of the resistor Rbb1 (see FIG. 1) via the output terminal 15f of the first bias circuit 15. That is, the transistor 15e and the resistor Rbb1 are emitter-follower connected.

The transistor 15e outputs the bias voltage (or the bias current) Bias1 from the emitter to the resistor Rbb1 depending on the potential Vbias1.

FIG. 1 is referred to again. A power amplifier circuit that amplifies a high frequency signal having a wide signal band is required to suppress gain fluctuations, that is, is required to flatten frequency characteristics of an amplitude gain in the signal band. Namely, such a power amplifier circuit is required to exhibit linear amplitude characteristics. Further, such a power amplifier circuit is required to exhibit high power efficiency in terms of suppression in power consumption and heat generation.

The power amplifier circuit 1 includes the high pass filter 11 as an input matching circuit for the first amplifier 13. Accordingly, the high frequency input signal RFin obtained by attenuating low frequency components by the high pass filter 11 is inputted into the base of the transistor Q1. As a result, characteristics of the maximum available power gain of the transistor Q1 are canceled and a signal level in the signal band of the high frequency signal RF1 outputted from the collector of the transistor Q1 therefore exhibits the high pass characteristics. Namely, the first amplifier 13 can suppress gain fluctuation and flatten frequency characteristics of an amplitude gain in the signal band. The first amplifier 13 is thus able to obtain linear amplitude characteristics.

Here, in an amplifier circuit in which a plurality of amplifiers are connected in multiple stages, the transistor size (the number of fingers) is larger and more power is consumed as it goes to posterior stages, as described above. That is, the transistor Q2 has the larger transistor size (the larger number of fingers) and consumes more power than the transistor Q1.

For example, it is considered to use a high pass filter instead of the automatic transformer 18 as an inter-stage matching circuit between the first amplifier 13 and the second amplifier 20, in FIG. 1. In this configuration, the high pass filter serving as the inter-stage matching circuit attenuates the high frequency signal RF1 near the lower limit frequency of the signal band. Power loss accordingly occurs near the lower limit frequency of the signal band in the transistor Q2. The power consumption of the transistor Q2 is larger than the power consumption of the transistor Q1. Therefore, the power loss occurring in the transistor Q2 is larger than the power loss occurring in the transistor Q1. That is, the influence of the power loss occurring in the transistor Q2 is larger than the influence of the power loss occurring in the transistor Q1, causing large degradation in overall power efficiency of the power amplifier circuit 1.

The power amplifier circuit 1 therefore includes the automatic transformer 18 as the inter-stage matching circuit between the first amplifier 13 and the second amplifier 20, as illustrated in FIG. 1. The automatic transformer 18 is an example of a wideband and low-loss matching circuit and suppresses attenuation of the high frequency signal RF1 near the lower limit frequency of the signal band. Accordingly, the second amplifier 20 can suppress power loss in the transistor Q2 near the lower limit frequency of the signal band. The power amplifier circuit 1 is thus capable of suppressing degradation in overall power efficiency thereof.

First Comparison Example

In terms of the position of the automatic transformer 18 serving as a matching circuit, the automatic transformer 18 may be provided not only as the inter-stage matching circuit between the first amplifier 13 and the second amplifier 20 of the power amplifier circuit 1 (see FIG. 1) but also as an input matching circuit for the first amplifier 13.

Figure 5:
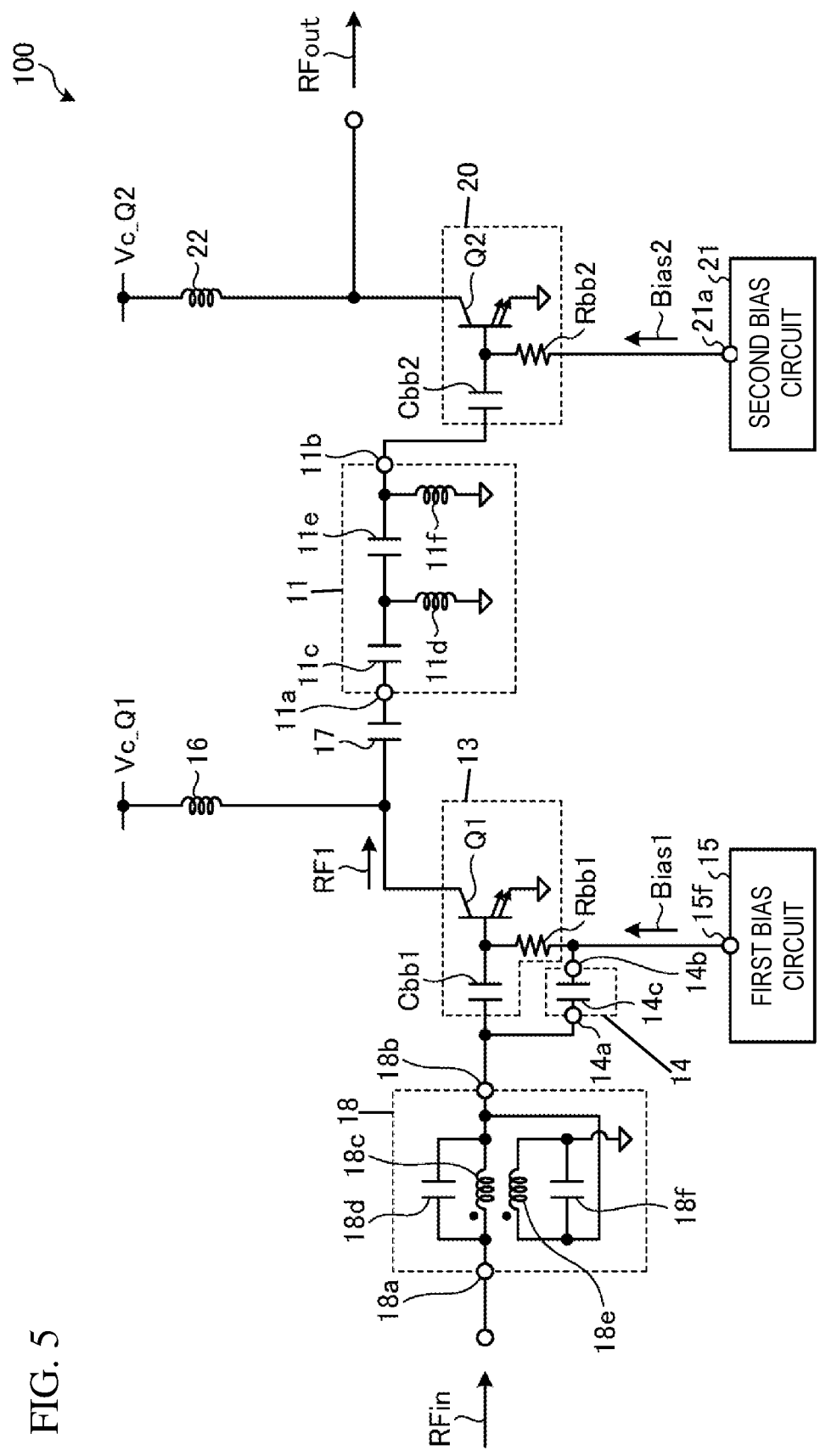
FIG. 5 illustrates the configuration of a power amplifier circuit according to a first comparison example.

FIG. 5 illustrates the configuration of a power amplifier circuit according to a first comparison example. Compared to the configuration of the power amplifier circuit (see FIG. 1) according to the first embodiment, the position of the high pass filter 11 and the position of the automatic transformer 18 are replaced to each other in the configuration of a power amplifier circuit 100. That is, in the power amplifier circuit 100, the automatic transformer 18 is the input matching circuit for the first amplifier 13 and the high pass filter 11 is the inter-stage matching circuit between the first amplifier 13 and the second amplifier 20. Other configurations in the power amplifier circuit 100 are the same as those in the power amplifier circuit 1, so description thereof will be omitted.

Comparison Between First Embodiment and First Comparison Example

Figure 6:
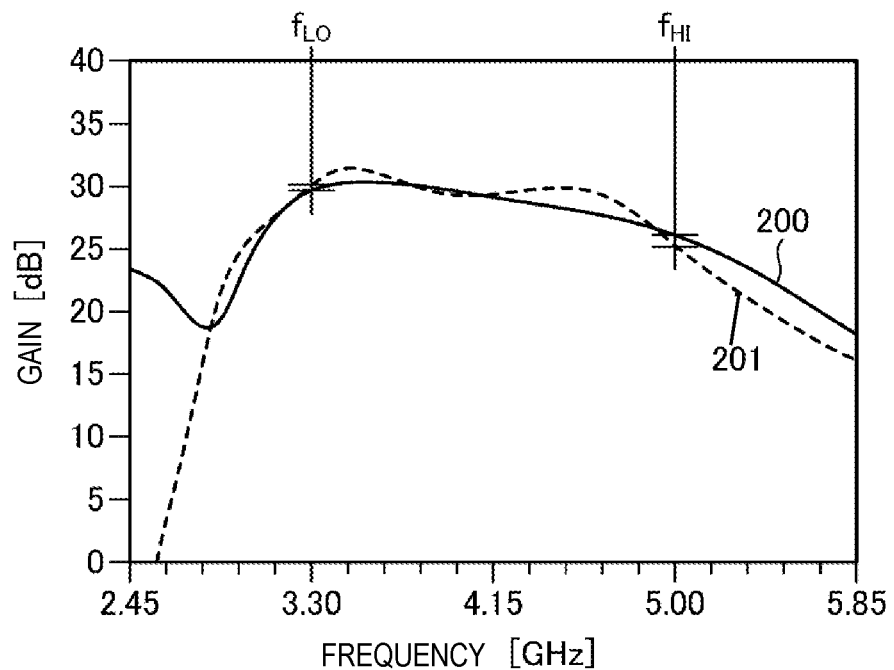
FIG. 6 illustrates circuit simulation results of the first embodiment and the first comparison example.
Figure 7:
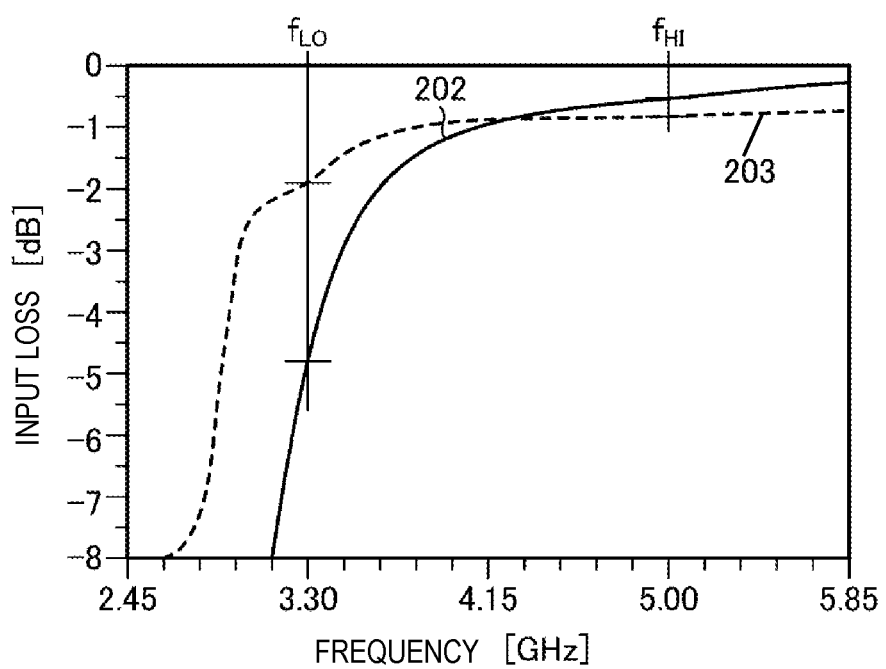
FIG. 7 illustrates circuit simulation results of the first embodiment and the first comparison example.
Figure 8:
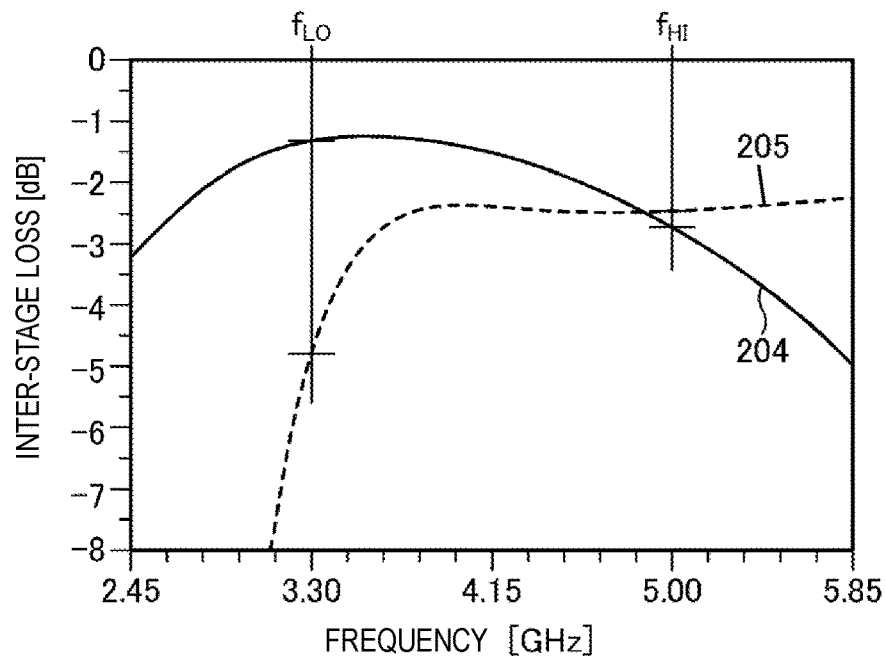
FIG. 8 illustrates circuit simulation results of the first embodiment and the first comparison example.
Figure 9:
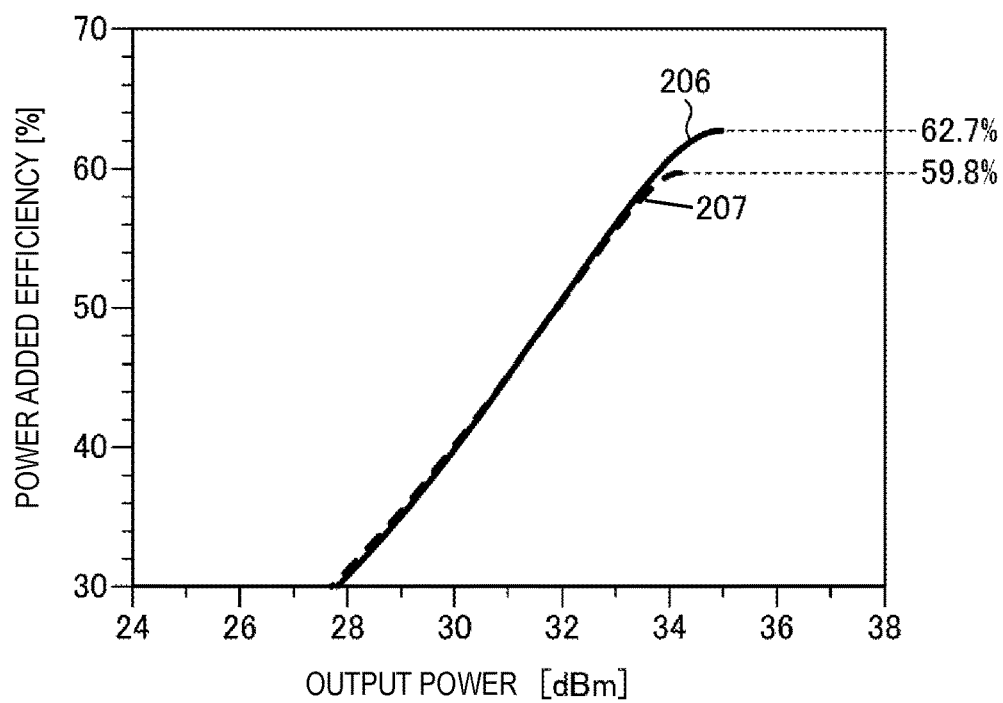
FIG. 9 illustrates circuit simulation results of the first embodiment and the first comparison example.
Figure 10:
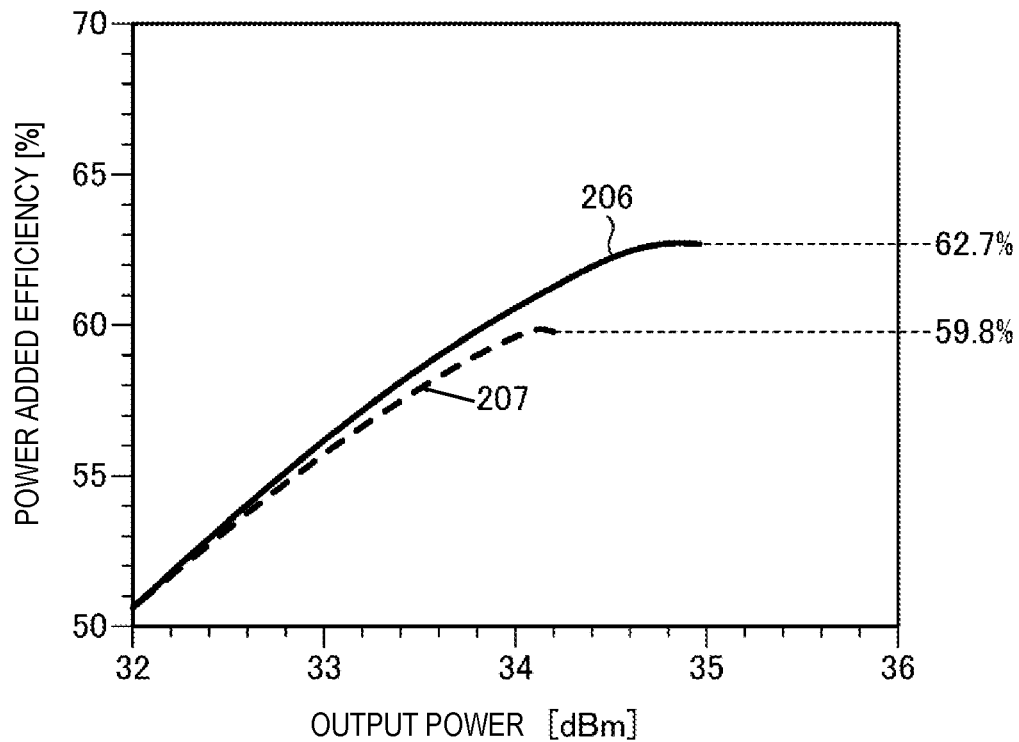
FIG. 10 illustrates circuit simulation results of the first embodiment and the first comparison example.

FIGS. 6 to 10 illustrate circuit simulation results of the first embodiment and the first comparison example. More specifically, FIG. 6 illustrates the circuit simulation results on overall gains of the power amplifier circuit 1 and the power amplifier circuit 100. FIG. 7 illustrates the circuit simulation results on input loss of the power amplifier circuit 1 (loss of the high pass filter 11) and input loss of the power amplifier circuit 100 (loss of the automatic transformer 18). FIG. 8 illustrates the circuit simulation results on inter-stage loss of the power amplifier circuit 1 (loss of the automatic transformer 18) and inter-stage loss of the power amplifier circuit 100 (loss of the high pass filter 11). In FIGS. 6 to 8, a signal band is from a lower limit frequency $f_{LO}$ to an upper limit frequency $f_{HI}$. 3.30 gigahertz (GHz) is exemplified as the lower limit frequency $f_{LO}$. 5.00 GHz is exemplified as the upper limit frequency $f_{HI}$. FIG. 9 illustrates the circuit simulation results on power added efficiencies (PAEs) of the power amplifier circuit 1 and the power amplifier circuit 100 at the lower limit frequency $f_{LO}$ of the signal band. FIG. 10 is a partially enlarged diagram of FIG. 9.

Referring to FIG. 6, a waveform 200 represents the overall gain of the power amplifier circuit 1. A waveform 201 represents the overall gain of the power amplifier circuit 100 which is the comparison example. At the lower limit frequency $f_{LO}$ of the signal band, the overall gain of the power amplifier circuit 1 and the overall gain of the power amplifier circuit 100 are substantially the same as each other.

Referring to FIG. 7, a waveform 202 represents the input loss of the power amplifier circuit 1 (loss of the high pass filter 11). A waveform 203 represents the input loss of the power amplifier circuit 100 which is the comparison example (loss of the automatic transformer 18). At the lower limit frequency $f_{LO}$ of the signal band, the input loss of the power amplifier circuit 1 (the loss of the high pass filter 11) is larger than the input loss of the power amplifier circuit 100 (the loss of the automatic transformer 18).

Referring to FIG. 8, a waveform 204 represents the inter-stage loss of the power amplifier circuit 1 (loss of the automatic transformer 18). A waveform 205 represents the inter-stage loss of the power amplifier circuit 100 which is the comparison example (loss of the high pass filter 11). At the lower limit frequency $f_{LO}$ of the signal band, the inter-stage loss of the power amplifier circuit 1 (the loss of the automatic transformer 18) is smaller than the inter-stage loss of the power amplifier circuit 100 (the loss of the high pass filter 11).

Referring to FIG. 9 and FIG. 10, a waveform 206 represents the power added efficiency of the power amplifier circuit 1 at the lower limit frequency $f_{LO}$ of the signal band. A waveform 207 represents the power added efficiency of the power amplifier circuit 100 at the lower limit frequency $f_{LO}$ of the signal band. The peak value of the power added efficiency of the power amplifier circuit 100 is 59.8%, while the peak value of the power added efficiency of the power amplifier circuit 1 is 62.7%. That is, the peak value of the power added efficiency of the power amplifier circuit 1 is improved by 2.9% (2.9 points) from the peak value of the power added efficiency of the power amplifier circuit 100. These simulation results prove that loss suppression in the inter-stage matching circuit (the input matching circuit for the posterior transistor Q2) at the lower limit frequency $f_{LO}$ of the signal band contributes to improvement in power added efficiency.

Brief Summary

As described above, the power amplifier circuit 1 according to the first embodiment includes the high pass filter 11 as the input matching circuit for the first amplifier 13, being able to suppress gain fluctuation and flatten frequency characteristics of an amplitude gain in a signal band. Accordingly, the power amplifier circuit 1 can obtain linear amplitude characteristics.

Further, the power amplifier circuit 1 according to the first embodiment includes the automatic transformer 18 as the inter-stage matching circuit between the first amplifier 13 and the second amplifier 20, being able to suppress power loss in the transistor Q2 at the lower limit frequency $f_{LO}$ of the signal band. Accordingly, the power amplifier circuit 1 can suppress power efficiency degradation.

Phenomenon that May Occur Due to Use of Automatic Transformer as Inter-Stage Matching Circuit When the automatic transformer 18 is used as the inter-stage matching circuit between the first amplifier 13 and the second amplifier 20 as the power amplifier circuit 1 of the first embodiment, the following phenomenon may occur.

The transistor Q1 on the previous stage becomes vulnerable to load fluctuation because of loss reduction by the automatic transformer 18 used as the inter-stage matching circuit. That is, input impedance fluctuation of the transistor Q2 on the posterior stage is easily observed as load impedance fluctuation of the transistor Q1 on the previous stage. In particular, when the high frequency input signal RFin is a large signal (large amplitude, large power) (hereinafter, sometimes referred to as "in the large signal operation"), the transistor Q2 non-linearly behaves and base bias voltage falls due to increase in base bias current of the transistor Q2, resulting in input impedance fluctuation of the transistor Q2. Accordingly, a matching state is lost when the high frequency input signal RFin is a small signal (small amplitude, small power) (hereinafter, sometimes referred to as "in the small signal operation"). This is exposed, in terms of characteristics, as phase change (AM/PM characteristics) and gain reduction (AM/AM characteristics) in the transistor Q1.

Therefore, the power amplifier circuit 1 according to the first embodiment (see FIG. 1) includes the impedance circuit 14 between the other end 11b of the high pass filter 11 and the other end of the resistor Rbb1. The impedance circuit 14 passes the high frequency input signal RFin after passing through the high pass filter 11. The high frequency input signal RFin after passing through the impedance circuit 14 is inputted into the emitter of the transistor 15e of the first bias circuit 15 (see FIG. 4). The transistor 15e accordingly performs a detection operation, so the bias voltage Bias1 therefore rises. Drop of the base bias voltage of the transistor Q1 is thus suppressed. Accordingly, the power amplifier circuit 1 can suppress phase change and gain reduction in the transistor Q1, thereby being able to suppress distortion of the high frequency output signal RFout.

Figure 11:
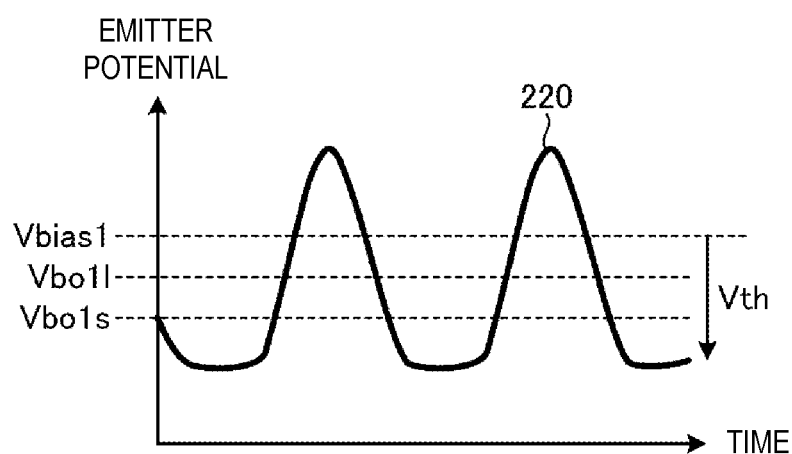
FIG. 11 illustrates a circuit simulation result of the power amplifier circuit according to the first embodiment.

FIG. 11 illustrates a circuit simulation result of the power amplifier circuit according to the first embodiment. More specifically, FIG. 11 illustrates the circuit simulation result on emitter potential of the transistor 15e of the first bias circuit 15 (see FIG. 4). The potential Vbias1 is base potential of the transistor 15e (see FIG. 4). Potential Vbo1$s$ is static emitter potential of the transistor 15e in the absence of signals.

The potential Vbias1 of the base of the transistor 15e is fixed at a constant value. Accordingly, the lower limit of emitter potential Vbo1 is clipped at (Vbias1−Vth) with threshold voltage Vth of the transistor 15e in the large signal operation. Here, the upper limit of the emitter potential Vbo1 is not clipped. This raises an average value of the emitter potential Vbo1 from Vbo1$s$ to Vbo1$l$. Accordingly, drop of the base bias voltage of the transistor Q1 in the large signal operation is suppressed.

Second Comparison Example

Figure 12:
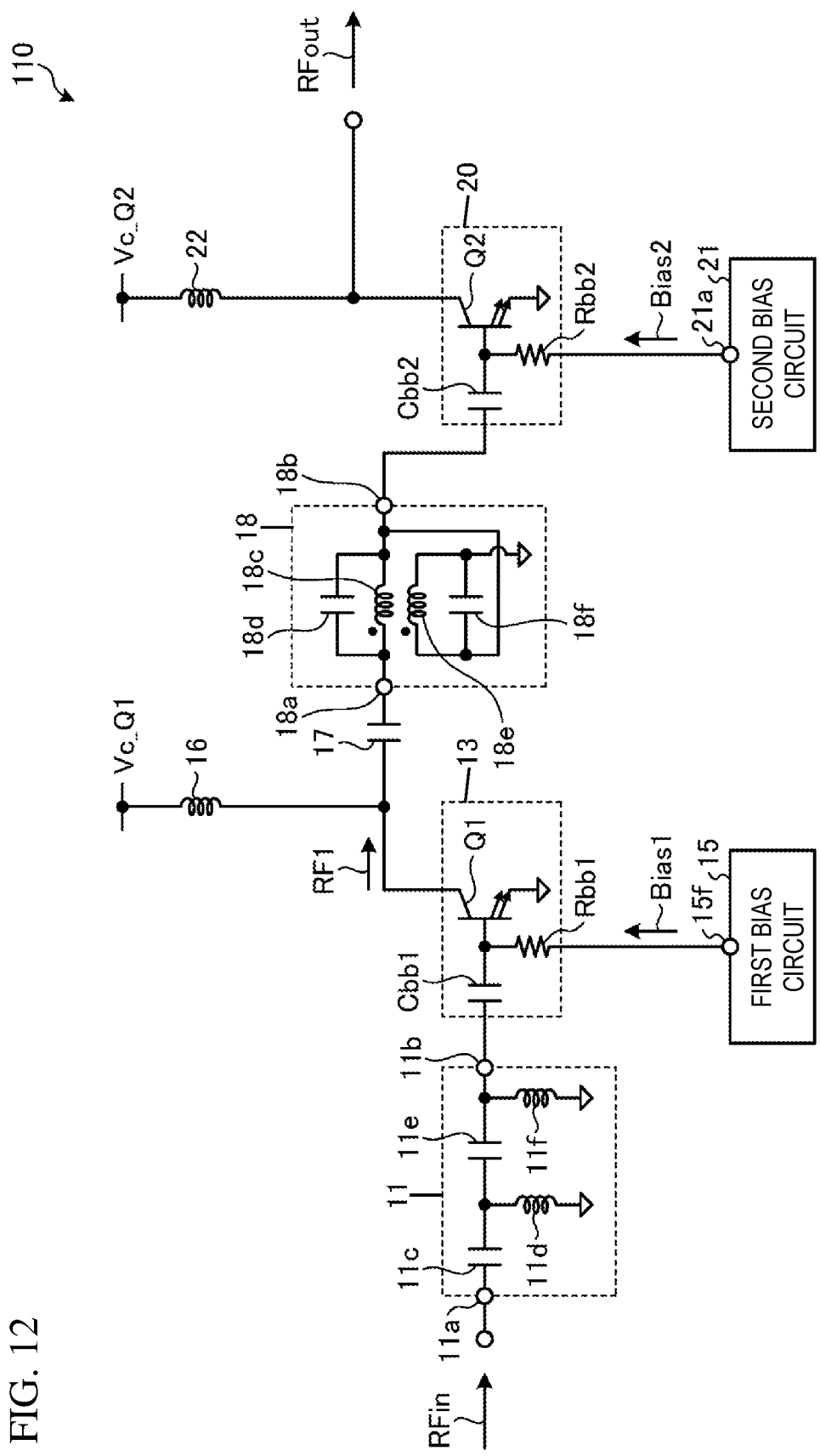
FIG. 12 illustrates the configuration of a power amplifier circuit according to a second comparison example.

FIG. 12 illustrates the configuration of a power amplifier circuit according to a second comparison example. Compared to the configuration of the power amplifier circuit (see FIG. 1) according to the first embodiment, the configuration of a power amplifier circuit 110 does not include the impedance circuit 14. Other configurations in the power amplifier circuit 110 are the same as those in the power amplifier circuit 1, so description thereof will be omitted.

Comparison Between First Embodiment and Second Comparison Example

Figure 13:
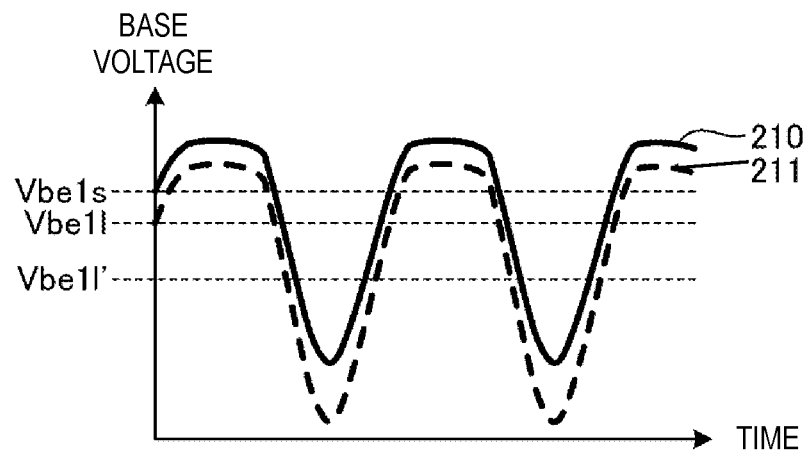
FIG. 13 illustrates circuit simulation results of the first embodiment and the second comparison example.

FIG. 13 illustrates circuit simulation results of the first embodiment and the second comparison example. More specifically, FIG. 13 illustrates the circuit simulation results on base bias voltage of the transistor Q1 in the power amplifier circuit 1 and the power amplifier circuit 110.

Referring to FIG. 13, a waveform 210 represents the base bias voltage of the transistor Q1 in the power amplifier circuit 1. A waveform 211 represents the base bias voltage of the transistor Q1 in the power amplifier circuit 110. Voltage Vbe1s is static base bias voltage of the transistor Q1 in the absence of signals.

In the power amplifier circuit 110 which is the comparison object, the base bias voltage of the transistor Q1 is clipped by restriction of base bias current in a voltage region higher than the voltage Vbe1s. Accordingly, average voltage Vbe1l' of the base bias voltage of the transistor Q1 drops in the power amplifier circuit 110.

On the other hand, in the power amplifier circuit 1 of the first embodiment, the high frequency input signal RFin is inputted into the emitter of the transistor 15e via the impedance circuit 14 and the transistor 15e performs the detection operation, so the bias voltage Bias1 rises and the base bias voltage of the transistor Q1 rises. Consequently, the average voltage Vbe1l of the base bias voltage of the transistor Q1 rises to be higher than the average voltage Vbe1l' and the drop of the base bias voltage of the transistor Q1 is thus suppressed in the power amplifier circuit 1.

Accordingly, the transistor Q1 is kept in an ON state without necessary changing into an OFF state even in the large signal operation and the power amplifier circuit 1 of the first embodiment is thus able to suppress phase change and gain fluctuation in the transistor Q1. The power amplifier circuit 1 is thereby capable of suppressing distortion of the high frequency output signal RFout.

Figure 14:
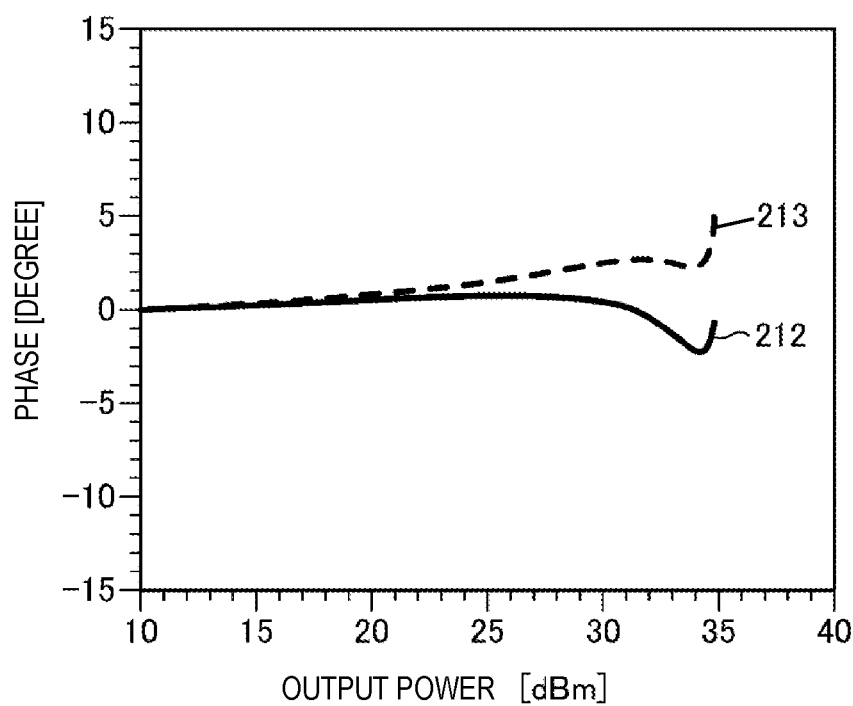
FIG. 14 illustrates circuit simulation results of the first embodiment and the second comparison example.
Figure 15:
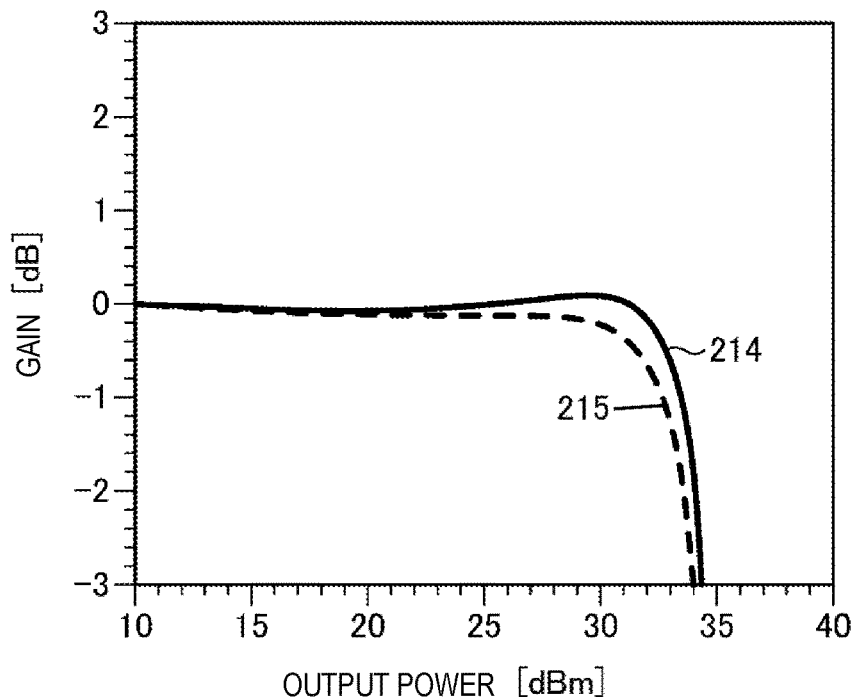
FIG. 15 illustrates circuit simulation results of the first embodiment and the second comparison example.
Figure 16:
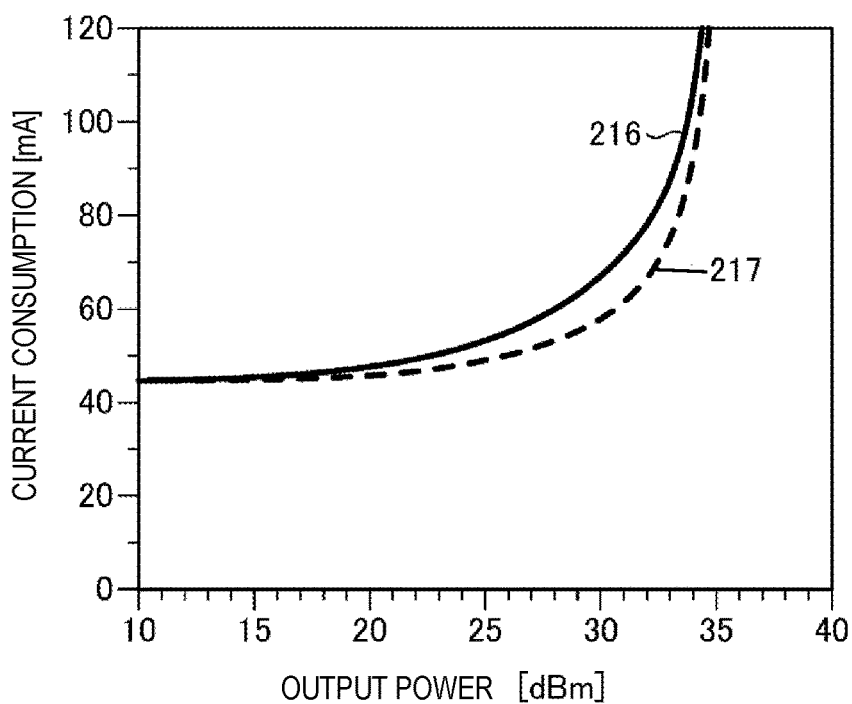
FIG. 16 illustrates circuit simulation results of the first embodiment and the second comparison example.
Figure 17:
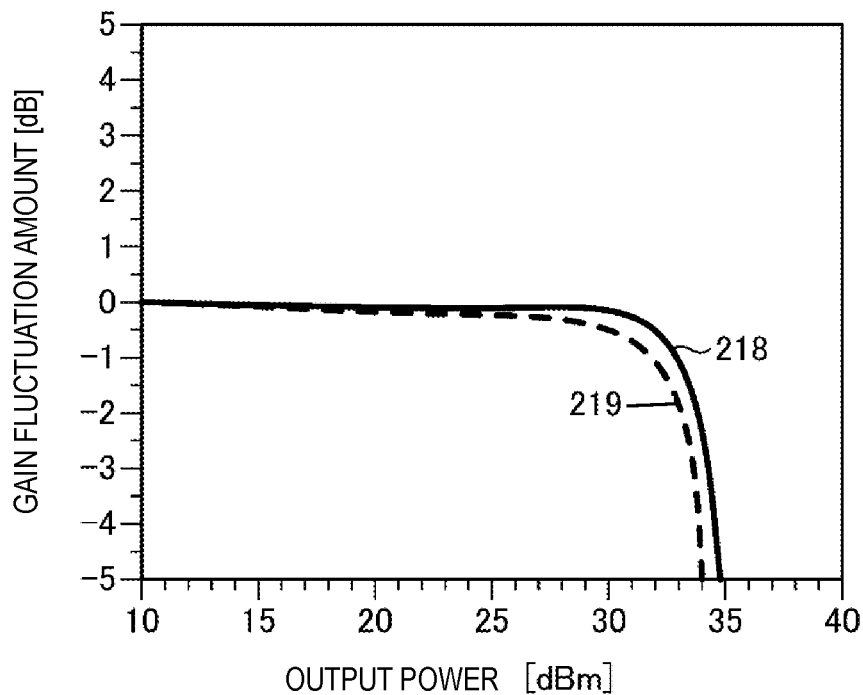
FIG. 17 illustrates circuit simulation results of the first embodiment and the second comparison example.

FIGS. 14 to 17 illustrate circuit simulation results of the first embodiment and the second comparison example. More specifically, FIG. 14 illustrates the circuit simulation results on phases of the high frequency output signal RFout of the power amplifier circuit 1 and the power amplifier circuit 110. FIG. 15 illustrates the circuit simulation results on gains of the power amplifier circuit 1 and the power amplifier circuit 110 which is the comparison object. FIG. 16 illustrates the circuit simulation results on current consumptions of the transistor Q1 in the power amplifier circuit 1 and the power amplifier circuit 110. FIG. 17 illustrates the circuit simulation results on gain fluctuation amounts with respect to gains in the small signal operation in the power amplifier circuit 1 and the power amplifier circuit 110.

Referring to FIG. 14, a waveform 212 represents the phase of the high frequency output signal RFout of the power amplifier circuit 1. A waveform 213 represents the phase of the high frequency output signal RFout of the power amplifier circuit 110 which is the comparison object. As illustrated by the waveform 212, the phase change of the high frequency output signal RFout of the power amplifier circuit 1 is improved (suppressed) compared to the phase change of the high frequency output signal RFout of the power amplifier circuit 110.

Referring to FIG. 15, a waveform 214 represents the gain of the power amplifier circuit 1. A waveform 215 represents the gain of the power amplifier circuit 110 which is the comparison object. As illustrated by the waveform 214, the gain of the power amplifier circuit 1 is improved (increased) compared to the gain of the power amplifier circuit 110. In comparison to the power amplifier circuit 110, P2dB (output power in 2 dB gain compression) is increased by approximately 0.4 dB in the power amplifier circuit 1.

Referring to FIG. 16, a waveform 216 represents the current consumption of the transistor Q1 of the power amplifier circuit 1. A waveform 217 represents the current consumption of the transistor Q1 of the power amplifier circuit 110 which is the comparison object. As illustrated by the waveform 216, the current consumption of the transistor Q1 of the power amplifier circuit 1 is higher than the current consumption of the transistor Q1 of the power amplifier circuit 110. This is caused by suppressing the drop of the base bias voltage (caused by the rise of the base bias voltage) in the transistor Q1 of the power amplifier circuit 1, as described above. However, the rate of the current consumption of the transistor Q1 is very small with respect to the overall current consumption of the power amplifier circuit 1. Thus, the current consumption of the transistor Q1 does not largely affect the overall power efficiency of the power amplifier circuit 1.

Referring to FIG. 17, a waveform 218 represents the gain fluctuation amount with respect to the gain in the small signal operation in the power amplifier circuit 1. A waveform 219 represents the gain fluctuation amount with respect to the gain in the small signal operation in the power amplifier circuit 110 which is the comparison object. As illustrated by the waveform 218, the gain fluctuation amount of the power amplifier circuit 1 is improved (suppressed) compared to the gain fluctuation amount of the power amplifier circuit 110. In the power amplifier circuit 1, gain reduction is suppressed by the rise of the base bias voltage of the transistor Q1, raising P2dB (output power in 2 dB gain compression).

Overall Summary

As described above, the power amplifier circuit 1 according to the first embodiment includes the high pass filter 11 as the input matching circuit for the first amplifier 13, being able to suppress gain fluctuation and flatten frequency characteristics of an amplitude gain in a signal band. Accordingly, the power amplifier circuit 1 can obtain linear amplitude characteristics.

Further, the power amplifier circuit 1 according to the first embodiment includes the automatic transformer 18 as the inter-stage matching circuit between the first amplifier 13 and the second amplifier 20, being able to suppress power loss in the second amplifier 20 at the lower limit frequency $f_{LO}$ of the signal band. Accordingly, the power amplifier circuit 1 can suppress power efficiency degradation.

Furthermore, the power amplifier circuit 1 according to the first embodiment includes the impedance circuit 14 between the other end 11b of the high pass filter 11 and the other end of the resistor Rbb1, being able to raise the bias voltage Bias1. Accordingly, the power amplifier circuit 1 can suppress phase change and gain reduction.

Second Embodiment

The automatic transformer 18 is the inter-stage matching circuit between the first amplifier 13 and the second amplifier 20 in the first embodiment, but the present disclosure is not limited to this. Any matching circuit may be employed as the inter-stage matching circuit as long as the matching circuit is a wideband and low-loss matching circuit.

Figure 18:
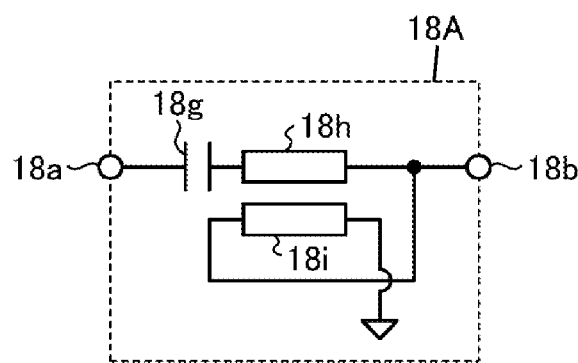
FIG. 18 illustrates the configuration of an inter-stage matching circuit according to a second embodiment.

FIG. 18 illustrates the configuration of an inter-stage matching circuit according to a second embodiment. The inter-stage matching circuit illustrated in FIG. 18 is a transmission line transformer (TLT).

A transmission line transformer 18A includes a capacitor 18g, a first line 18h, and a second line 18i.

One end of the capacitor 18g is electrically connected with one end 18a of the transmission line transformer 18A. The other end of the capacitor 18g is electrically connected with one end of the first line 18h. The other end of the first line 18h is electrically connected with the other end 18b of the transmission line transformer 18A. One end of the second line 18i is electrically connected with the other end of the first line 18h. The other end of the second line 18i is electrically connected with a reference potential.

The transmission line transformer 18A is an example of the wideband and low-loss matching circuit that performs impedance matching between output impedance of the first amplifier 13 and input impedance of the second amplifier 20.

Third Embodiment

Figure 19:
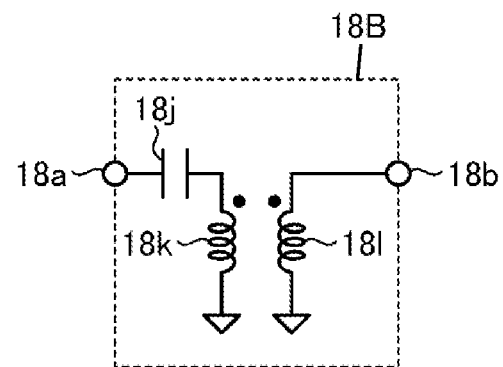
FIG. 19 illustrates the configuration of an inter-stage matching circuit according to a third embodiment.

FIG. 19 illustrates the configuration of an inter-stage matching circuit according to a third embodiment. The inter-stage matching circuit illustrated in FIG. 19 is a conventional transformer 18B.

The conventional transformer 18B includes a capacitor 18j, a primary winding 18k, and a secondary winding 18l. The conventional transformer 18B is a transformer that magnetically couples the primary winding 18k and the secondary winding 18l, whose winding ratio is 1:n, with each other so as to realize impedance conversion at a conversion ratio of 1:n^2.

One end of the capacitor 18j is electrically connected with one end 18a of the conventional transformer 18B. The other end of the capacitor 18j is electrically connected with one end of the primary winding 18k. The other end of the primary winding 18k is electrically connected with a reference potential. One end of the secondary winding 18l is electrically connected with the other end 18b of the conventional transformer 18B. The other end of the secondary winding 18l is electrically connected with the reference potential.

The conventional transformer 18B is an example of the wideband and low-loss matching circuit that performs impedance matching between output impedance of the first amplifier 13 and input impedance of the second amplifier 20.

Fourth Embodiment

The impedance circuit 14 includes the capacitor 14c in the first embodiment, but the present disclosure is not limited to this. Any circuit may be employed as the impedance circuit 14 as long as the circuit is able to block DC components of the high frequency input signal RFin after passing through the high pass filter 11 and pass AC components of the same.

Figure 20:
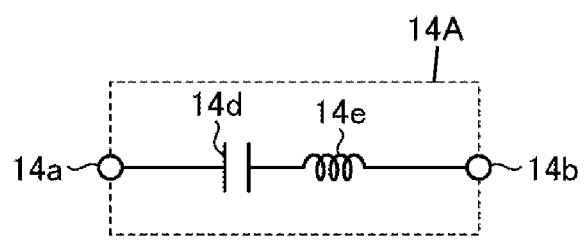
FIG. 20 illustrates the configuration of an impedance circuit according to a fourth embodiment.

FIG. 20 illustrates the configuration of an impedance circuit according to a fourth embodiment.

An impedance circuit 14A includes a capacitor 14d and an inductor 14e. One end of the capacitor 14d is electrically connected with one end 14a of the impedance circuit 14A. The other end of the capacitor 14d is electrically connected with one end of the inductor 14e. That is, the capacitor 14d and the inductor 14e are LC-connected in series. The other end of the inductor 14e is electrically connected with the other end 14b of the impedance circuit 14A. Here, one end of the capacitor 14d may be electrically connected with the other end 14b of the impedance circuit 14A and the other end of the inductor 14e may be electrically connected with one end 14a of the impedance circuit 14A.

The impedance circuit 14A blocks DC components of the high frequency input signal RFin after passing through the high pass filter 11 and passes AC components of the same.

Fifth Embodiment

One impedance circuit 14 is provided in the first embodiment, but the present disclosure is not limited to this. The first amplifier 13 may include a plurality of cells that respectively include unit transistors each of which amplifies the high frequency input signal RFin and outputs the high frequency signal RF1 obtained through the amplification, and a plurality of impedance circuits may be respectively included in the plurality of cells.

Figure 21:
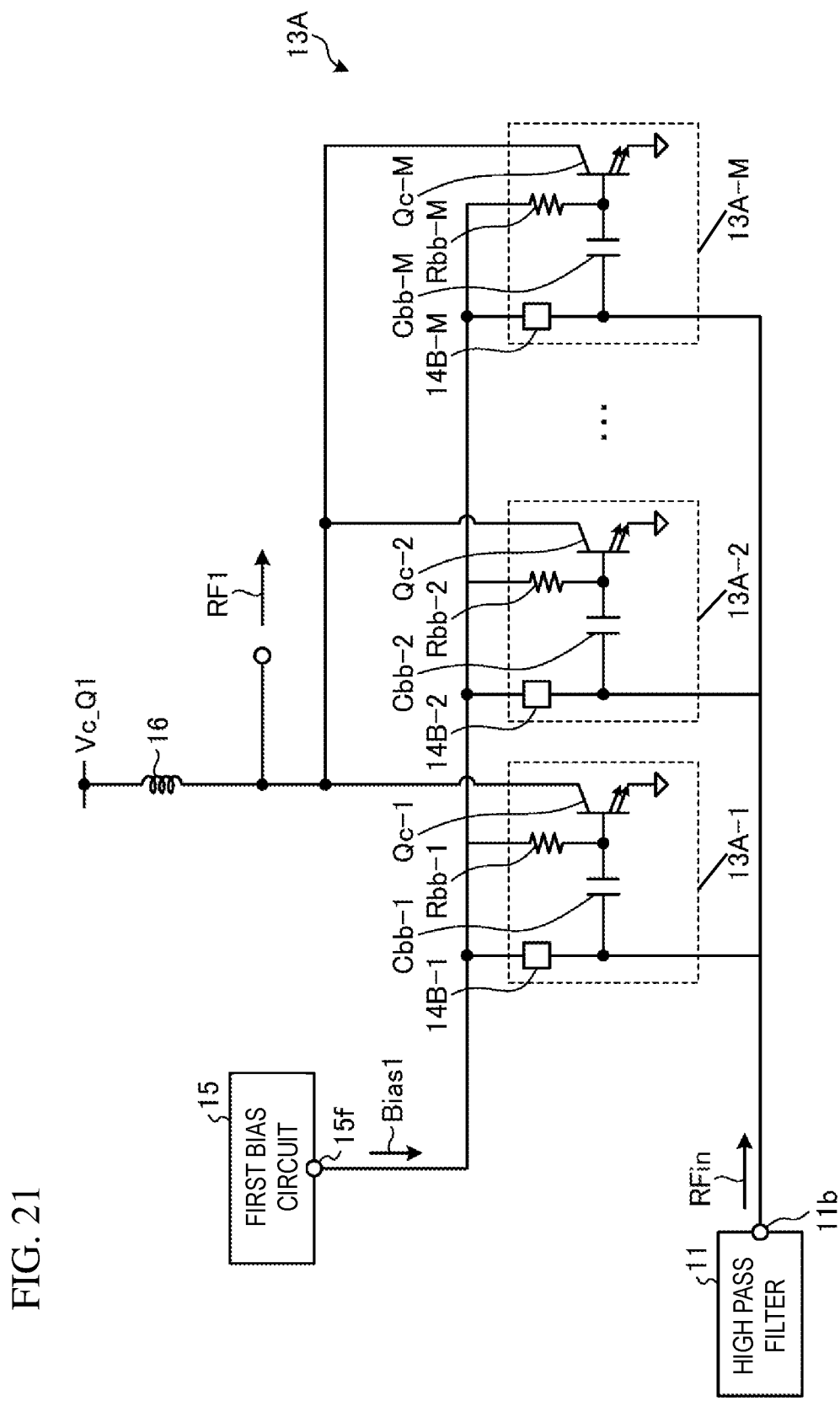
FIG. 21 illustrates the configuration of a first amplifier according to a fifth embodiment.

FIG. 21 illustrates the configuration of a first amplifier according to a fifth embodiment. A first amplifier 13A includes M pieces of cells that are a cell 13A-1, a cell 13A-2, . . . , and a cell 13A-M.

The cell 13A-1 includes the cell capacitor Cbb-1, the cell resistor Rbb-1, the unit transistor Qc-1, and an impedance circuit 14B-1. The impedance circuit 14B-1 is electrically connected between a couple of the other end 11b of the high pass filter 11 and one end of the cell capacitor Cbb-1 and a couple of the output terminal 15f of the first bias circuit 15 and the other end of the cell resistor Rbb-1.

The cell 13A-2 includes the cell capacitor Cbb-2, the cell resistor Rbb-2, the unit transistor Qc-2, and an impedance circuit 14B-2. The impedance circuit 14B-2 is electrically connected between a couple of the other end 11b of the high pass filter 11 and one end of the cell capacitor Cbb-2 and a couple of the output terminal 15f of the first bias circuit 15 and the other end of the cell resistor Rbb-2.

The cell 13A-M includes the cell capacitor Cbb-M, the cell resistor Rbb-M, the unit transistor Qc-M, and an impedance circuit 14B-M. The impedance circuit 14B-M is electrically connected between a couple of the other end 11b of the high pass filter 11 and one end of the cell capacitor Cbb-M and a couple of the output terminal 15f of the first bias circuit 15 and the other end of the cell resistor Rbb-M.

The impedance circuits 14B-1 to 14B-M correspond to the impedance circuit 14 or 14A.

The first amplifier 13A is capable of adjusting a constant of each impedance circuit 14B depending on deviation (individual difference) in amplitude characteristics of each cell caused by the cell arrangement. Therefore, phase change and gain reduction in each unit transistor Qc can be more precisely suppressed. Thus, the first amplifier 13A is capable of more precisely suppressing distortion of the high frequency output signal RFout.

It should be noted that the above-described embodiments are provided not for limitedly interpreting the present disclosure but for facilitating the understanding of the present disclosure. The present disclosure can be modified/improved without necessary departing from the spirit thereof, and the present disclosure also includes an equivalent thereof.

While embodiments of the disclosure have been described above, it is to be understood that variations and modifications will be apparent to those skilled in the art without necessary departing from the scope and spirit of the disclosure. The scope of the disclosure, therefore, is to be determined solely by the following claims.

What is claimed is:

1. A power amplifier circuit comprising:
   a high pass filter into which a high frequency input signal is inputted at a first end;

a first amplifier configured to amplify the high frequency input signal and to output a first amplified high frequency signal, the high frequency input signal being outputted from a second end of the high pass filter;
a second amplifier configured to amplify the first amplified high frequency signal and to output a second amplified high frequency output signal;
an automatic transformer that is electrically connected between the first amplifier and the second amplifier, and that is configured to perform impedance matching between the first amplifier and the second amplifier; and
an impedance circuit having a first end electrically connected to the second end of the high pass filter, and a second end electrically connected to an output terminal of a bias circuit,
wherein the bias circuit is configured to output a bias voltage or a bias current to the first amplifier, and
wherein the impedance circuit is configured to supply the high frequency input signal from the second end of the high pass filter to the output terminal of the bias circuit.

2. A power amplifier circuit comprising:
a high pass filter into which a high frequency input signal is inputted at a first end;
a first amplifier configured to amplify the high frequency input signal and to output a first amplified high frequency signal, the high frequency input signal being outputted from a second end of the high pass filter;
a second amplifier configured to amplify the first amplified high frequency signal and to output a second amplified high frequency;
a transmission line transformer that is electrically connected between the first amplifier and the second amplifier, and that is configured to perform impedance matching between the first amplifier and the second amplifier; and
an impedance circuit having a first end electrically connected to the second end of the high pass filter, and a second end electrically connected to an output terminal of a bias circuit,
wherein the bias circuit is configured to output a bias voltage or a bias current to the first amplifier, and
wherein the impedance circuit is configured to supply the high frequency input signal from the second end of the high pass filter to the output terminal of the bias circuit.

3. A power amplifier circuit comprising:
a high pass filter into which a high frequency input signal is inputted at a first end;
a first amplifier configured to amplify the high frequency input signal and to output a first amplified high frequency signal, the high frequency input signal being outputted from a second end of the high pass filter;
a second amplifier configured to amplify the first amplified high frequency signal and to output a second amplified high frequency output signal;
a conventional transformer that is electrically connected between the first amplifier and the second amplifier, and that is configured to perform impedance matching between the first amplifier and the second amplifier; and
an impedance circuit having a first end electrically connected to the second end of the high pass filter, and a second end electrically connected to an output terminal of a bias circuit,
wherein the bias circuit is configured to output a bias voltage or a bias current to the first amplifier,
wherein the impedance circuit is configured to supply the high frequency input signal from the second end of the high pass filter to the output terminal of the bias circuit, and
wherein the second end of the impedance circuit is electrically connected to an emitter of a transistor, and
wherein the transistor is in the bias circuit, is emitter-follower connected, and is configured to output the bias voltage or the bias current from the emitter.

4. The power amplifier circuit according to claim 1,
wherein the first amplifier comprises a plurality of cells that each comprise a unit transistor, each of the unit transistors being configured to amplify the high frequency input signal and to output an amplified high frequency signal, and
wherein the impedance circuit comprises a plurality of unit impedance circuits, each of the plurality of cells further comprising a respective one of the plurality of unit impedance circuits.

5. The power amplifier circuit according to claim 2,
wherein the first amplifier comprises a plurality of cells that each comprise a unit transistor, each of the unit transistors being configured to amplify the high frequency input signal and to output an amplified high frequency signal, and
wherein the impedance circuit comprises a plurality of unit impedance circuits, each of the plurality of cells further comprising a respective one of the plurality of unit impedance circuits.

6. The power amplifier circuit according to claim 3,
wherein the first amplifier comprises a plurality of cells that each comprise a unit transistor, each of the unit transistors being configured to amplify the high frequency input signal and to output an amplified high frequency signal, and
wherein the impedance circuit comprises a plurality of unit impedance circuits, each of the plurality of cells further comprising a respective one of the plurality of unit impedance circuits.

7. The power amplifier circuit according to claim 1, wherein the impedance circuit comprises a capacitor.

8. The power amplifier circuit according to claim 2, wherein the impedance circuit comprises a capacitor.

9. The power amplifier circuit according to claim 3, wherein the impedance circuit comprises a capacitor.

10. The power amplifier circuit according to claim 1, wherein the impedance circuit comprises a capacitor and an inductor connected in series with each other.

11. The power amplifier circuit according to claim 2, wherein the impedance circuit comprises a capacitor and an inductor connected in series with each other.

12. The power amplifier circuit according to claim 3, wherein the impedance circuit comprises a capacitor and an inductor connected in series with each other.

13. The power amplifier circuit according to claim 1,
wherein the second end of the impedance circuit is electrically connected to an emitter of a transistor, and
wherein the transistor is in the bias circuit, is emitter-follower connected, and is configured to output the bias voltage or the bias current from the emitter.

14. The power amplifier circuit according to claim 2,
wherein the second end of the impedance circuit is electrically connected to an emitter of a transistor, and
wherein the transistor is in the bias circuit, is emitter-follower connected, and is configured to output the bias voltage or the bias current from the emitter.

* * * * *